United States Patent [19]

Grula et al.

[11] Patent Number: 5,296,392
[45] Date of Patent: Mar. 22, 1994

[54] METHOD OF FORMING TRENCH ISOLATED REGIONS WITH SIDEWALL DOPING

[75] Inventors: Gregory J. Grula, Charlton; Walter C. Metz, Shrewsbury, both of Mass.

[73] Assignee: Digital Equipment Corporation, Maynard, Mass.

[21] Appl. No.: 841,239

[22] Filed: Feb. 24, 1992

Related U.S. Application Data

[63] Continuation of Ser. No. 737,796, Jul. 25, 1991, abandoned, which is a continuation of Ser. No. 488,994, Mar. 6, 1990, abandoned.

[51] Int. Cl.$^5$ .................. H01L 21/225; H01L 21/302
[52] U.S. Cl. ........................ 437/34; 437/56; 437/67; 437/160; 437/162
[58] Field of Search ............... 437/67, 57, 160, 162, 437/228, 34, 56

[56] References Cited

U.S. PATENT DOCUMENTS

| | | | |
|---|---|---|---|
| 4,274,892 | 6/1981 | Templin | 437/162 |
| 4,306,916 | 12/1981 | Wollesen et al. | 437/56 |
| 4,480,375 | 11/1984 | Cottrell | 437/57 |
| 4,507,158 | 3/1985 | Kamins et al. | 148/175 |
| 4,509,249 | 4/1985 | Goto | 29/576 W |
| 4,569,701 | 2/1986 | Oh | 148/188 |
| 4,609,413 | 9/1986 | Boland | 148/175 |
| 4,666,556 | 5/1987 | Fulton et al. | 156/643 |
| 4,676,847 | 5/1987 | Lin | 148/188 |
| 4,692,992 | 9/1987 | Hsu | 437/57 |
| 4,745,081 | 5/1988 | Beyer et al. | 437/38 |
| 4,820,654 | 4/1989 | Lee | 437/67 |
| 5,028,552 | 7/1991 | Ushiku | 437/57 |
| 5,075,242 | 12/1991 | Nakahara | 437/57 |

FOREIGN PATENT DOCUMENTS 0217962  8/1989  Japan ..................... 437/57

OTHER PUBLICATIONS

Davari et al., "A Variable-Size Shallow Trench Isolation (STI) Technology with Diffused Sidewall Doping for Sub-Micron CMOS", IEDM Tech. Dig. 1988, pp. 92-95.

Sheldon et al., "Application of a Two-Layer Planarization Process to VLSI Intermetal Dielectric and Trench Isolation Processes", IEEE Transactions on Semiconductor Manufacturing, vol. 1, No. 4, pp. 140-145, Nov. 1988.

Yamabe et al., "Non-planar oxidation and reduction of oxide leakage currents at silicon corners by rounding-off oxidation", IEEE Transactions on Electron Devices, vol. Ed. 34, No. 8, Aug. 1987, pp. 1681-1686.

Mizuno et al., "New Doping Method for Subhalf Micron Trench Sidewalls by Using an Electron Cyclotron Resonance Plasma", Appl. Phys. Lett., Nov. 1988.

Shiltz et al., "Two Layer Planarization Process", J. Electrochem. Soc.: Solid State Science and Technology, Jan. 1986, pp. 178-181.

Shibata et al., "A Simplified Box (Buried-Oxide) Technology for Megabit Dynamic Memories", IEDM Tech. Dig. 1983, pp. 27-30.

Fuse et al., "A New Isolation Method with Boron-Implanted Sidewalls for Controlling Narrow-Width Effect", IEEE Transactions on Electron Devices, vol. Ed. 34, No. 2, Feb. 1987, pp. 356-359.

Primary Examiner—Olik Chaudhuri
Assistant Examiner—Ourmazd S. Ojan
Attorney, Agent, or Firm—Arnold, White & Durkee

[57] ABSTRACT

In a semiconductor substrate, a method of forming a shallow isolation trench having a doped sidewall is disclosed. A shallow trench having nearly vertical walls is formed in the semiconductor substrate. A doped silicon layer is selectively grown on a sidewall and a portion of the bottom of the trench. The dopant from the silicon layer is then driven into the substrate by a suitable method such as annealing. The trench is subsequently filled with a dielectric material.

9 Claims, 3 Drawing Sheets

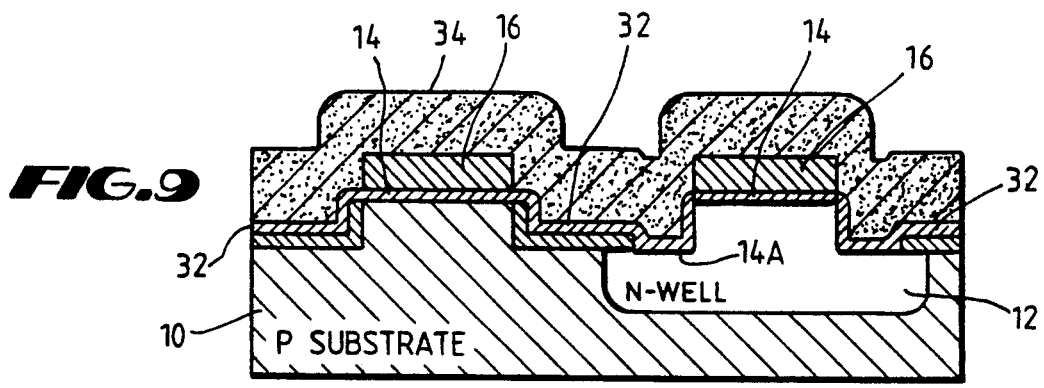
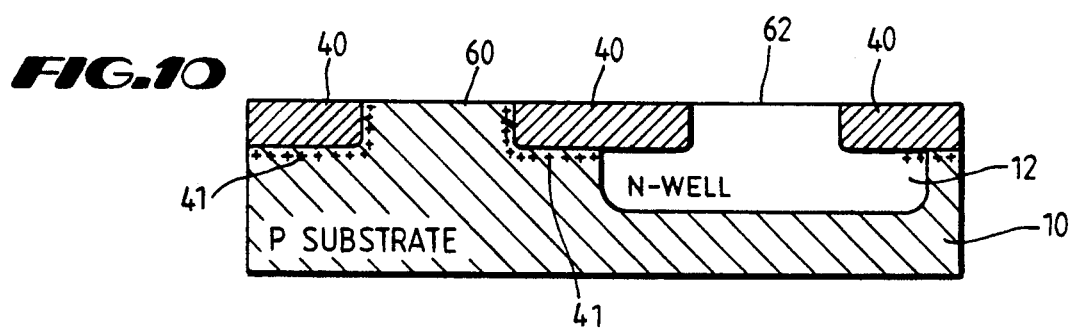
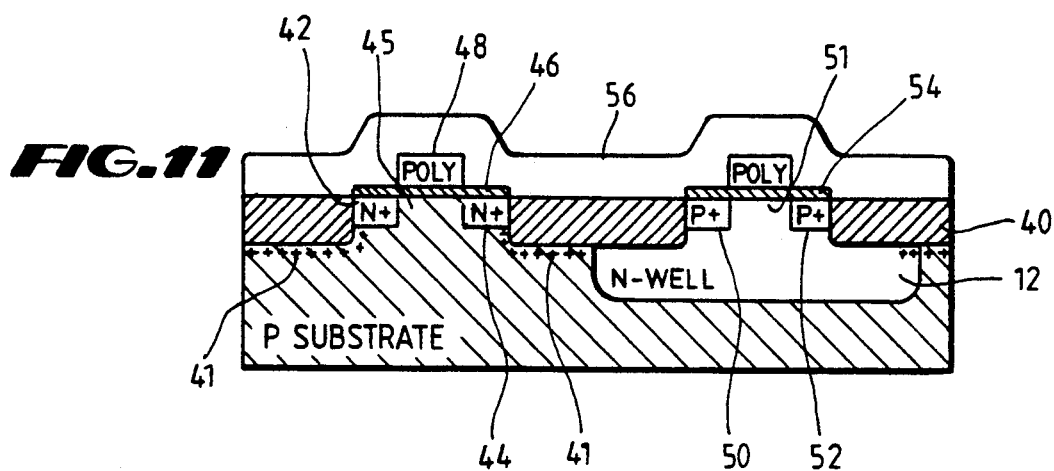

METHOD OF FORMING TRENCH ISOLATED REGIONS WITH SIDEWALL DOPING

This application is a continuation of application Ser. No. 07/737,796, filed Jul. 25, 1991, now abandoned, which is a continuation of application Ser. No. 07/488,994, filed Mar. 6, 1990, also now abandoned.

BACKGROUND OF THE INVENTION

1. Field of the Invention

This invention relates to a method of forming shallow semiconductor device isolation trenches.

2. Description of the Prior Art

Semiconductor integrated circuit devices, especially very large scale integrated circuits ("VLSI"), such as high density memory products like Dynamic Random Access Memories are becoming more and more dense, i.e., more transistors in a given area. These products are continually requiring smaller and smaller transistors. In high density VLSI's, it is necessary to electrically isolate adjoining transistors. Isolation trenches filled with a dielectric, normally Silicondioxide, are presently being used to isolate adjacent transistors and other devices which require isolation. In the state of the art VLSI's, the minimum feature size has reached submicron level. It is, therefore, extremely desirable to make isolation trenches as small and as reliable as possible.

Shallow trench isolation has been proposed as a means to achieve reliable submicron isolation trenches. In CMOS technology, an inherent difficulty in obtaining adequate N-Channel MOSFET behavior when using trench isolation is controllability of current conduction along the trench sidewalls. Higher dopant concentration on the trench sidewalls compared to the trench top and or bottom will generally suppress early transistor turn-on by increasing the threshold voltage of the parasitic edge transistor.

In CMOS Technology, P-type substrates containing N-wells therein are commonly used. NMOSFETS are formed in the P-substrate while the PMOSFETS are formed in the N-wells. In a CMOS device, NMOSFETS and PMOSFETS are isolated from each other by a shallow trench which isolates the P-substrate and the N-well. Likewise, isolation trenches separate NMOSFETS from NMOSFETS, and PMOSFETS from PMOSFETS on the same substrate. However, any sidewall dopant used must be absent from the portion of the trench which is in the N-well. The two trench sidewalls which define width dimensions of a MOSFET also act as parasitic transistors electrically connected in parallel with the normal planar transistor. For the NMOSFET, these parasitic sidewall transistors have a lower threshold voltage (Vt) than the planar transistor. This Vt difference is due to a higher fixed positive charge generated at the silicon substrate and silicon dioxide sidewall interface and/or an unfavorable P-dopant (generally boron) segregation constant. The latter factor results in the surface P-type dopant concentration being depressed below its bulk value during the trench oxidation step. For PMOSFETS, the sidewall parasitic devices have a higher Vt (larger negative value) than the planar device as the effect of higher fixed positive charge and a favorable segregation constant of phosphorus will act t increase the threshold voltage.

A configuration without sidewall doping would upset the off state of the NMOSFET, i.e., when biased with a gate voltage below Vt. The lower Vt of the parasitic sidewall transistors provides a parallel conduction path which allows undesirable excess current to flow from source to drain terminals in this off state. To counteract this problem, the Vt of parasitic sidewall NMOSFETS must be increased. A practical means of achieving this is to dope the trench sidewalls with the P-type dopant by some means.

The level of transistor off-current is especially important in circuits containing dynamic design. It may be possible to reduce the level of off-current leakage by two orders of magnitude with inclusion of sidewall doping. In addition, sidewall doping may be beneficial in suppressing the inverse narrow width behavior of threshold voltage often observed in shallow trench isolation.

The shape of the trench corners is also of concern for thin gate oxide reliability. Round active area corners are desired to minimize electric field intensification and/or oxide thinning at these corners. Both of these phenomena contribute to high oxide leakage current of transistors built with shallow trench isolation. Rounding of the trench corners is commonly done by additional thermal oxidation steps. The present invention, however, enables one to achieve the desired degree of roundness without any additional oxidation step.

For the foregoing reasons, in the art of making semiconductor devices, it is very desirable to make shallow trenches. Various trench sidewall doping methods for shallow trenches have been proposed. However, each of these methods has drawbacks relating to either the controllability of the dopant or higher manufacturing costs because specialized equipment may be required. For example, Fuse et al., "A New Isolation Method with Boron-Implanted Sidewalls for Controlling Narrow Width Effect," IEEE Transaction Electron Devices, February 1987, discloses implanting trench sidewalls using large-tilt angle of the ion beam. Large-tilt angle is not easily implemented on commercially available implant machines because they are usually preset at a 5–9 degree beam angle incident to the silicon wafer surface to reduce ion channeling. Implantation of vertical trench sidewalls done at this low incident beam angle results in only the lower portion of the trench sidewall receiving dopant. To ensure symmetrical device behavior, all four sides of the trench must be implanted at the desired angle. The wafer must be rotated three times, which results in lower throughput during manufacturing. Although ion implanters with variable tilt angles have recently become commercially available, they are more expensive than the conventional fixed angle ion implanters, and they still require repositioning or rotation of wafers during ion-implantation of the regions such as trench sidewalls. Shibata et al., "A Simplified Box (Buried—Oxide) Isolation Technology of Megabit Dynamic Memories," IEDM Technical Digest, 1983, utilizes tapered trench sidewall profiles which allows the conventional low incident angle of the ion beam to implant a greater portion of the trench sidewall. But, when tapered trench sidewalls are used, it is difficult to maintain consistent trench profiles during subsequent resist-etch processing steps. Also, the transistor width is decreased because of resist erosion during the trench etch. Furthermore, vertical trench sidewalls are more desirable because they enable narrower trenches and thus providing higher density.

Diffusion from CVD doped oxide and/or doped polysilicon are methods which dope the entire trench sidewall. The film can be either boro-silicate glass (BSG) or in-situ boron doped polysilicon. The film is deposited over the entire wafer surface, i.e. trench bottom and sidewalls and usually must be removed using a conventional resist patterning/etch from locations where no dopant is desired After heat treatment, which transfers dopant into the trench sidewall, the diffusion source is again removed so that normal processing can continue. In the case of the doped oxide diffusion source, precise control of dopant in the oxide is critical to controlling silicon surface doping concentration after drive-in. This degree of control is often not achievable with conventional low pressure chemical vapor deposition (LPCVD) of oxide.

Diffusion from a doped polysilicon source suffers from difficulty of removing the polysilicon after drive-in since the polysilicon must be directly deposited on the trench which is formed in a single crystal silicon wafer. Complex chemical etchants are required to remove the polysilicon but not the crystal silicon.

Doping using electron cyclotron resonance plasma has been used in the art, but it is presently considered impractical due to the unavailability of equipment and/or high implementation cost.

The present invention overcomes a number of disadvantages of the prior art methods by providing a method of making shallow isolation trenches having properly doped sidewalls, wherein the desired doping of the trench sidewalls and the bottom surface is done by selectively forming a properly doped silicon (polysilicon or epitaxial) layer thereon. Oxidation of the trenches, dielectric fill and etch back of the wafer, and the formation of the N-Channel and P-Channel MOSFETS are done by conventional methods.

SUMMARY OF THE INVENTION

A method of forming a shallow isolation trench in a semiconductor substrate is disclosed. The method of the invention includes the steps of forming a shallow trench having near vertical walls, selectively forming a properly doped thin silicon layer on the trench regions, so that the silicon layer covers at least one wall and a portion of the bottom of the trench region. The dopant from the silicon layer is driven into the substrate and the trench is filled with a dielectric material, such as oxide.

These and other features and advantages of the present invention will become apparent with reference to the following detailed description of the preferred embodiment thereof in connection with the accompanying drawings wherein like reference numerals have been applied to like elements, in which:

BRIEF DESCRIPTION OF THE DRAWINGS

FIG. 9 depicts the structure of FIG. 8 after forming a thin oxide layer over the silicon layer and filling the trenches with oxide.

FIG. 10 depicts the structure after planarization and etch-back of the structure of FIG. 9 to yield a substrate wherein shallow isolation channels have been formed.

FIG. 11 depicts the structure of FIG. 10 after N-channel and P-channel MOSFETS have been formed.

DESCRIPTION OF THE PREFERRED EMBODIMENTS

A method of forming shallow trench isolation regions with sidewall doping is described.

The method is described in the context of making a CMOS device on a single crystal P-type silicon wafer or substrate, because presently a majority of VLSI's are made on such P-substrates. It will, however, be apparent to one skilled in the art of making semiconductor devices that the method described herein is equally applicable when an N-type substrate is used and that the method is not limited to the making of CMOS devices.

Figure 1:
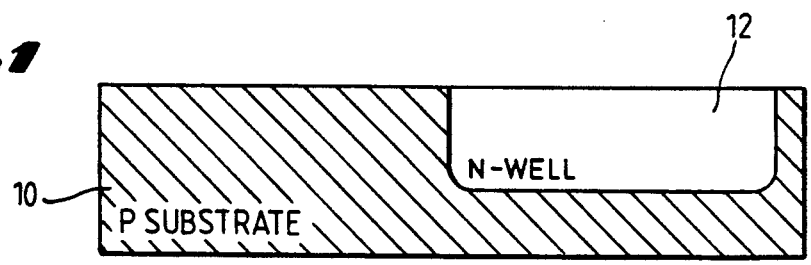
FIG. 1 depicts the cross-section of a portion of a P-type silicon substrate which contains an N-well.

A CMOS device contains an N-Channel and a P-Channel MOSFET or transistor. It is well known in the art of making semiconductor devices that to make CMOS devices on a P-type wafer, N-wells are made in the P-type wafer or substrate where the P-channel transistors eventually will be formed. FIG. 1 shows a P-type wafer 10 on which an N-well 12 has been formed. The isolation trench portion of the CMOS process begins after the N-well has been formed in the P-type silicon wafer.

Figure 2:
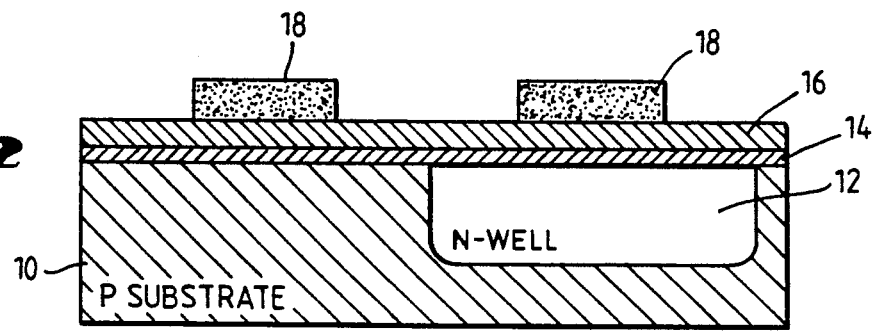
FIG. 2 depicts the structure of FIG. 1 after the formation of an oxide layer, a nitride layer and the masking of active regions.

Referring to FIG. 2, the next step is to grow a pad or initial oxide 14. The initial oxide 14 is thermally grown to a thickness of about 225 Angstroms. Silicon nitride 16, about 1800 Angstroms thick, is then deposited over the pad oxide 14 via chemical vapor deposition (CVD) at 800-850 degrees Celsius. The active regions, i.e., where either a P-Channel or an N-Channel transistor will be formed, are then masked with photoresist 18, while field regions, i.e., regions where trenches o where no transistors will be formed remain clear.

Figure 3:
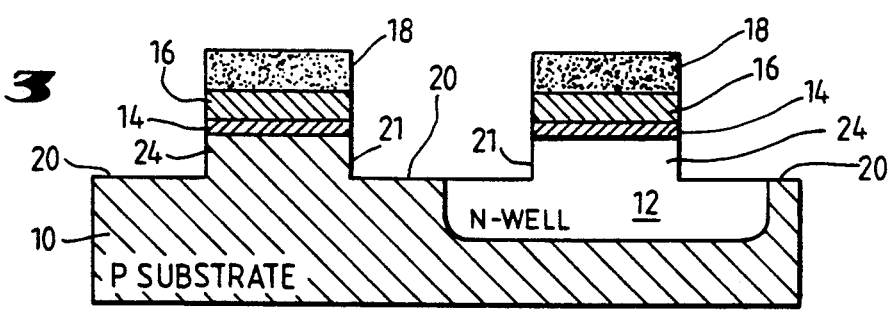
FIG. 3 depicts the structure of FIG. 2 after trenches have been formed in the Silicon substrate.

The field regions are then anisotropically etched to form trenches 20 in the silicon substrate 10, as shown in FIG. 3. A typical isolation channel has a rectangular configuration with vertical walls and it will separate an N-Channel transistor from an adjacent P-Channel transistor, and also the same type transistors. Chlorine and freon based plasmas are generally used to etch the nitride 16, oxide 14 and silicon 10 to form shallow trenches 20 which have the desired vertical sidewalls 21. Nitride and oxide films may be etched from the field regions by using $SF_6/O_2/He$ chemistry at 200 militorr and 200 Watts until most of the pad oxide is removed. An overetch step is used to clear any remaining oxide from the field regions. Shallow trenches 20 may be etched by a $Cl_2/CF_4/O_2$ or $Cl_2/CHF_3/O_2/He$ plasma at 200 militorr, 450 watts, and 13.56 MHz or 200 watts at 100 KHz rf power for a time which is sufficient to provide trenches of desired depth, typically 5000-7500 Angstroms deep. Vertical trench sidewalls having a profile of 85 degrees to 90 degrees are achievable by this method. The cross-section of the silicon wafer with trenches 20 having vertical sidewalls 21 is shown in FIG. 3.

Figure 4:
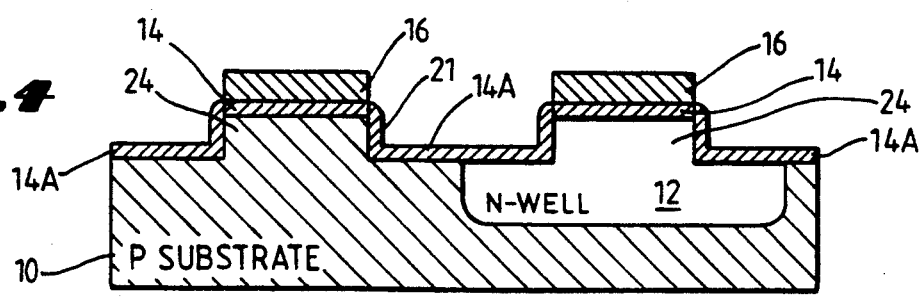
FIG. 4 depicts the structure of FIG. 3 after an oxide layer has been formed in the trenches.
Figure 5:
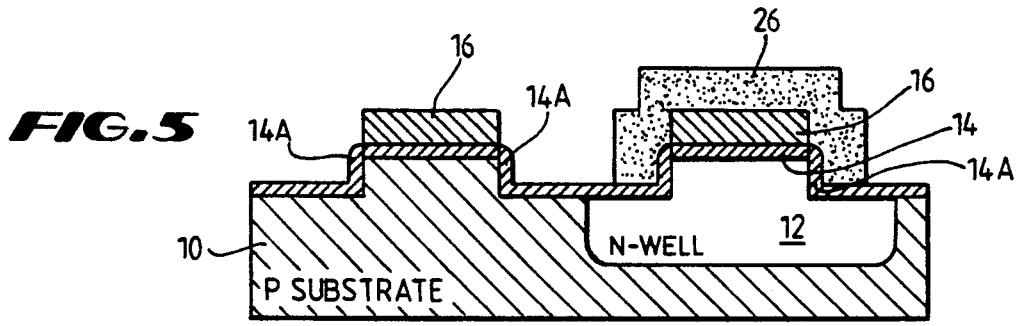
FIG. 5 depicts the structure of FIG. 4 after certain portions of the trench have been masked by a resist.
Figure 6:
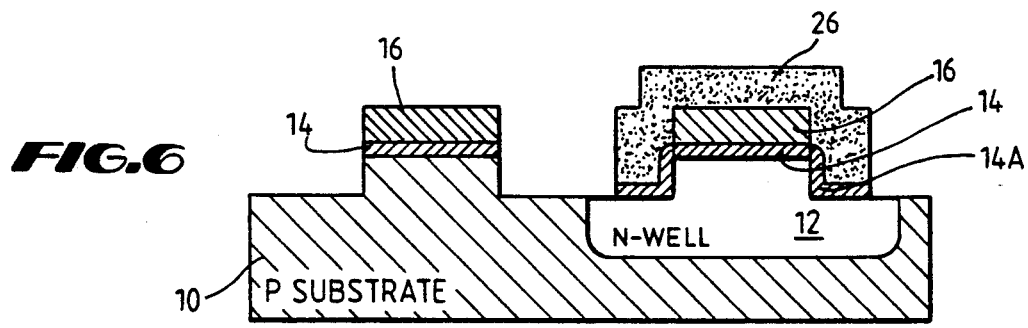
FIG. 6 depicts the structure of FIG. 5 after the oxide has been removed from portions of the trench where silicon layer will be formed.
Figure 7:
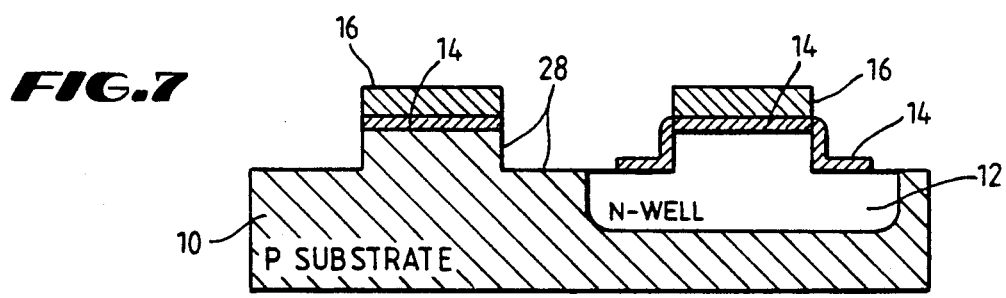
FIG. 7 depicts the structure of FIG. 6 after resist has been removed.

Referring now to FIGS. 3 and 4, the resist 18 from the active areas is then removed. After this resist strip, a thin blocker oxide 14A, 150–450 Angstroms thick, is thermally grown on the trench bottom 23 and the trench sidewalls 21, as shown in FIG. 4. Referring now to FIG. 5, the blocker oxide 14A is then patterned with a resist mask 26 that is an oversize of the P-Channel active area. The exposed regions of the blocker oxide 14A are then etched using a wet or a dry oxide etch process. FIG. 6 shows the cross-section of the device after exposed regions of the blocker oxide 14A have been removed or etched. The function of the blocker oxide 14A is to mask a portion of the trench in the N-Well field region from selective silicon growth, which is described below. Also, the oxidation of the silicon trench 20 anneals any damage caused by previous etching step and restores crystallinity of the silicon surface. The resist 26 is stripped before the next step of selective silicon growth. The cross-section of the resulting structure is shown in FIG. 7.

Figure 8:
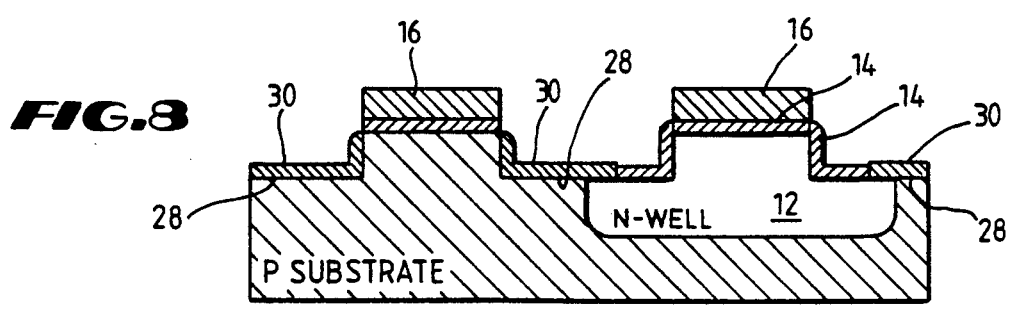
FIG. 8 depicts the structure of FIG. 7 after selectively forming the silicon layer in the trenches.

Preparation of the wafers before selective silicon deposition includes dipping the wafer in a 50:1 $H_2O$:HF solution to remove any native oxide, and an in-situ bake-out of the wafer at about 1000 degrees Celsius for about five minutes. Now referring to FIG. 8, a very thin silicon layer 30, 400–500 Angstroms thick, is then grown on the exposed walls and the bottom portions 28 of the trench of the structure of FIG. 7. The silicon layer 30 is normally grown at the same orientation as the single crystal silicon wafer and therefore it will become part of the silicon substrate. However, a polysilicon layer may instead be grown. To grow the selective silicon layer 30, the wafer shown in FIG. 7 is placed in an silicon reactor. Such reactors are commercially available and their use is well known in the art. The wafer is heated for about five minutes at about 1000 degrees Celsius in a hydrogen gas atmosphere. Anhydrous hydrogen chloride (HCL) is purged through the reactor prior to its introduction to the reaction chamber. A short time after HCL has been introduced into the reaction chamber (two to five seconds), a mixture of dichlorosilane (DCS), as the silicon source, and dilute diborane ($B_2H_6$) in hydrogen, as the P-type dopant, are introduced into the reaction chamber. The use of HCL is important because the kinetics of the silicon growth mechanism is such that the addition of HCL to DCS allows the nucleation of the silicon layer only on the exposed silicon 28 surface. And the introduction of HCL gas before introducing the DCS and $B_2H_6$ gases retards the nucleation of the silicon atoms and thus aids in controlling the growth of the silicon layer. By this method, a properly doped 400–500 Angstroms thick silicon layer can be grown in about 20–30 seconds. If the HCL gas is not introduced before the DCS and $B_2H_6$ gases, a 400–500 Angstroms thick silicon layer can be grown in about 10 seconds, which is about the time that it usually takes for all the gases to stabilize in the silicon reactor, making it difficult to grow a uniform silicon layer in such a short time. This, however, would be a less critical factor if the deposition temperature is reduced.

Now referring to FIG. 9, a trench oxide 32 is thermally grown, which is typically about 500 Angstroms thick but may range from 200–1000 Angstroms. The thermal oxidation of the trench sidewalls and bottom produces a high quality silicon/silicon dioxide interface which has good electrical integrity. Time and temperature can be adjusted before the actual growth of the oxide so as to drive-in the boron from the selective silicon layer into the trench sidewall and the trench bottom as shown by the numeral 41 in FIG. 10. This avoids the us of a separate step to drive-in boron into the wafer. Depending upon the thickness of the oxide, the selective silicon layer may be all consumed during the oxidation, even though FIG. 9 shows that the oxide layer 32 is merely grown on top of the silicon layer 30. A conformal CVD oxide 34 is then deposited over the entire wafer. Generally, the oxide is deposited from a liquid source at a temperature of 675 to 750 degrees Celsius and a pressure of 300 to 700 millitorr. The thickness of the CVD oxide 34 is approximately equal to the sum of the silicon trench depth, the pad oxide 14 and the nitride layer 16. The conformality of this oxide is critical in order to prevent void formation in submicron trenches. The oxide 34 is densified at a temperature of about 1000 degrees Celsius in an oxygen ambient followed by an in-situ nitrogen anneal.

After the trenches have been filled with conformal CVD, as shown in FIG. 9, oxide must be removed from all active regions 24 so that transistors may be formed in those regions. To accomplish this, it is necessary to globally planarize the wafer with a photoresist and then to simultaneously etchback the photoresist and CVD oxide 34. This etchback is normally done by reactive ion etching. The resulting structure in which the entire silicon layer has been consumed during thermal oxidation and the P-type impurity, i.e., boron, has bee driven into the substrate is shown FIG. 10. The wafer now will have well defined shallow trenches 40 with selectively doped sidewall and bottom 41.

To make a CMOS device, an N-Channel and a P-Channel transistor are formed in the active regions 60 and 62 respectively, as shown in FIG. 11. This may be accomplished by any of the available methods. To form an N-channel transistor, a thin gate oxide layer 46 is formed over the active region 60. A polysilicon gate 48 is then formed over a portion of the gate oxide layer 46. Spaced apart n-type source 42 and drain 44 are formed by ion implantation in the active region 60. The P-Channel transistor is formed in the active region 62, which is contained in the N-well. Numerals 50 and 52 respectively represent P-type source and drain, while numerals 54 and 56 represent the oxide layer and the polysilicon gate of the P-channel transistor.

In the preferred embodiment above, specific chemical compounds and specific values of various parameters, such as temperature, channel width and depth, thickness of various layers, power ratings, pressure ratings and the like have been used. These chemical compounds and parameter values have been provided by way of example only so as to more clearly explain the present invention. These values are not to be construed as limitations on the present invention. It will be understood that suitable values of these or other parameters or chemical compounds other than the ones specifically described above may be used to practice the present invention.

Furthermore, the foregoing description has been directed to a particular method of the invention for the purpose of illustration and explanation only. However, it will be apparent to on skilled in the art that many modifications and changes in the method of the present invention will be possible without departing from the scope of this invention. It is intended that the following claims be interpreted to embrace all such modifications and changes.

What is claimed is:

1. A method of making a semiconductor device having an isolation trench in a face of a silicon wafer, said wafer having an N-type area in said face adjacent a P-type area on said face, said N-type area being formed in said face using a first mask, said method comprising the steps of:
- (a) after said N-well has been formed, forming a trench in a first area of said face of the silicon wafer using a second mask, said first area being different in shape on said face than said N-type area, said trench being at and on both sides of an interface between said N-type and P-type areas of said face of the wafer, said trench having nearly vertical side walls and having a bottom surface extending across said interface so that an N-type trench area and a P-type trench area are exposed in the bottom surface of the trench on both sides of said interface;
- (b) selectively forming a silicon layer on one said wall and on a portion of the bottom surface of the trench over said P-type trench area and extending across said interface but not covering the major part of said N-type trench area of the bottom of the trench, said silicon layer being patterned using a third mask different from said first and second masks to define a second area of a shape on said face different from said N-type area and said first area so that said silicon layer extends across said interface, said silicon layer having a conductivity type dopant concentration which is greater than a P-type dopant concentration of said P-type area of the silicon wafer;
- (c) heating the wafer at a temperature and for a time which are sufficient to drive a part of the dopant from the silicon layer into the silicon wafer; and
- (d) filling the trench with a dielectric material.

2. The method of claim 1 wherein said trench is about 5000 Angstroms deep and between 5000–1000 Angstroms wide.

3. The method of claim 2 wherein said silicon layer is an epitaxial layer between 400–500 Angstroms thick.

4. The method of claim 1 wherein said silicon layer is a polysilicon layer between 400–500 Angstroms thick.

5. A method of forming an isolation trench in a face of a P-type substrate having an N-well at said face, the area of said N-well on said face being of a first shape, said method comprising the steps of:
- (a) using a mask of an area of said face of a second shape different from said first shape, with edges of said second shape being laterally spaced on said face from edges of said first shape, forming a trench in said face of the P-type substrate extending across an interface between said N-well and said P-type substrate, said trench having near vertical walls and a near horizontal bottom separating the walls; said bottom of said trench extending across said interface;
- (b) selectively forming a P-type silicon layer in an area of said face of a third shape different from said first and second shapes and only on selected P-type portions of the trench walls and bottom and extending across said interface; with edges of said third shape being laterally spaced on said face from edges of said second shape on said face;
- (c) forming a thin oxide layer on the silicon layer; and
- (d) depositing a silicon dioxide coating on said face of the silicon substrate thereby completely filling the isolation trench;
- (e) depositing a photoresist layer on said face of the silicon substrate to obtain a near planar surface; and
- (f) etching back both the photoresist and the silicon dioxide layer at said face until the silicon substrate is exposed to provide a planar surface.

6. A method of fabricating a CMOS device on a face of a first conductivity type silicon substrate having a second conductivity type well and an interface between said well and said substrate, said well being in an are of said face which is of a first shape on said face, said method comprising the steps of:
- (a) forming a trench in said face in an area of said face which is of a second shape different from said first shape, said trench having near vertical walls and a bottom surface separating said walls, said trench also separating a first active region in the substrate from a second active region in the well and a bottom area of said trench extending across said interface between the well and the substrate; edges of said second shape being laterally spaced on said face from edges of said first shape;
- (b) selectively forming a first conductivity type silicon layer in the trench while masking the walls of the trench in said well, said silicon layer also rounding trench corners, said silicon layer further having first conductivity type concentration which is greater than the concentration of the silicon substrate, said silicon layer being formed in an area of said face having a third shape on said face different from said first ad second shapes; edges of said third shape being laterally spaced on said face from edges of said second shape;
- (c) heating the substrate at a temperature and for a time which is sufficient to drive the first conductivity type impurity from the silicon layer into the substrate;
- (d) filling the trench with a dielectric material; and
- (e) forming a first-conductivity-type-channel transistor in the second active region and a second-conductivity-type-channel transistor in the first active region.

7. A method of forming an isolation trench in a face of a silicon substrate having a predetermined amount of P-type dopant concentration and having an N-well in said substrate, with an interface at said face between said well and the substrate, said N-well formed using a first mask so that the N-well occupies a first area of said face of said substrate, said method comprising the steps of:
- (a) forming a trench in said face of the silicon substrate using a second mask different from said first mask so that said trench occupies a second area of said face different from said first area, said trench having near vertical walls and a nearly flat bottom area separating the trench walls, said bottom area extending across said interface between the P-type substrate and the N-well;
- (b) using a third mask different from said first and second masks, selectively forming an oxide layer on selected portions of the walls and the bottom area of the trench on said N-well and leaving bare the walls and bottom area of said trench on P-type said substrate;
- (c) exposing the silicon substrate to anhydrous hydrogen chloride (HCL) gas and thereafter adding to the HCL a mixture of dichlorosilane and diborane in hydrogen at a predetermined temperature and for a predetermined time to controllably grow a silicon layer of a predetermined thickness, said diborane doping the silicon layer with a P-type impurity concentration that is greater than the P-type dopant concentration of the silicon substrate;

(d) driving some of the P-type dopant concentration from the silicon layer to the P-type silicon substrate; and (e) filling the trench with an oxide to obtain a planar silicon substrate surface having the isolation trench.

8. The method as described in claim 6 wherein said trench is between 5000–10000 Angstroms wide and about 5000 Angstroms deep, and said silicon layer is less than 500 Angstroms thick.

9. The method as described in claim 7 wherein said temperature and said time in step (c) are about 950 degrees Celsius and about 30 seconds respectively.

* * * * *

UNITED STATES PATENT AND TRADEMARK OFFICE
CERTIFICATE OF CORRECTION

PATENT NO. : 5,296,392
DATED : March 22, 1994
INVENTOR(S) : Gregory J. Grula and Walter C. Metz It is certified that error appears in the above-indentified patent and that said Letters Patent is hereby corrected as shown below:

Column 1, line 65, change "t" to --to--.

Column 4, line 42, change "o" to --or--.

Column 7, line 36, change "1000" to --10000--.

Column 8, line 7, change "are" to --area--.

Signed and Sealed this

Fifteenth Day of November, 1994

Attest:

BRUCE LEHMAN

Attesting Officer

Commissioner of Patents and Trademarks